US010955481B2

(12) United States Patent
Kondo

(10) Patent No.: US 10,955,481 B2
(45) Date of Patent: Mar. 23, 2021

(54) METHODS AND APPARATUS FOR DETERMINING A RESISTANCE VALUE OF A RESISTOR IN A BATTERY SYSTEM

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 472 days.

(21) Appl. No.: 15/974,919

(22) Filed: May 9, 2018

(65) Prior Publication Data
US 2019/0346510 A1 Nov. 14, 2019

(51) Int. Cl.
*G01R 31/36* (2020.01)
*G01R 31/3842* (2019.01)
*H02J 7/00* (2006.01)

(52) U.S. Cl.
CPC ..... *G01R 31/3842* (2019.01); *G01R 31/3644* (2013.01); *H02J 7/0077* (2013.01)

(58) Field of Classification Search
CPC .................. G01R 31/3644; G01R 31/3842
USPC .......................................................... 702/63
See application file for complete search history.

(56) References Cited

U.S. PATENT DOCUMENTS

| 5,648,717 A * | 7/1997 | Uskali ................... H01M 10/42 |
| | | 324/428 |
| 9,261,566 B2 * | 2/2016 | Gong .................... A61B 5/053 |
| 2009/0099799 A1 | 4/2009 | Barsoukov |
| 2013/0275067 A1 * | 10/2013 | Mikuteit ............. G01R 31/3648 |
| | | 702/63 |
| 2014/0172333 A1 | 6/2014 | Gopalakrishnan et al. |
| 2014/0203762 A1 | 7/2014 | Kato et al. |
| 2015/0032394 A1 | 1/2015 | Kimura et al. |
| 2015/0256011 A1 | 9/2015 | Shi |

FOREIGN PATENT DOCUMENTS

WO WO-2006100270 A1 * 9/2006 ............ G01R 31/36

* cited by examiner

*Primary Examiner* — Aditya S Bhat
(74) *Attorney, Agent, or Firm* — The Noblitt Group, PLLC; Hettie L. Haines

(57) ABSTRACT

Various embodiments of the present technology comprise a method and apparatus for determining a resistance value of a resistor in a battery system. In various embodiments, the apparatus comprises a sense resistor connected to a current sensor. The apparatus may be configured to compute a voltage-based RSOC value and a current-based RSOC value and extract a capacity value from each. Over time, the capacity values will diverge and the difference can be used to compute an actual value of the sense resistor.

20 Claims, 4 Drawing Sheets

METHODS AND APPARATUS FOR DETERMINING A RESISTANCE VALUE OF A RESISTOR IN A BATTERY SYSTEM

BACKGROUND OF THE TECHNOLOGY

A battery fuel gauge is generally employed to measure various operating conditions of a battery. For example, the fuel gauge may measure a battery voltage, a battery current, a battery capacity, and the like. These measured variables may then be used to better manage or otherwise control the charging and discharging functions of the battery to conserve power, extend the overall life of the battery, and the like. Therefore, accurate measurements of the battery current may be desired to provide effective management of the battery functions.

The battery fuel gauge typically employs a device connected to a sense resistor, with a known nominal resistance value, that measures the voltage drop across the resistor and is able to extract the battery current. The actual value of the resistor, however, may vary from its nominal value. For example, the nominal value of the resistor may be 2 m-ohms, but may have a margin of error (i.e., tolerance) of up to +/−2%. Accordingly, the actual current varies from the expected current. In such cases, the resistor variation may be large enough to substantially influence the extracted current such that the current contains a large margin of error. Accordingly, the extracted current is not accurate enough for effective battery management. Removing the resistor from the system to directly measure the resistance value may be expensive and/or time consuming.

SUMMARY OF THE INVENTION

Various embodiments of the present technology comprise a method and apparatus for determining a resistance value of a resistor in a battery system. In various embodiments, the apparatus comprises a sense resistor, having a nominal value, connected to a fuel gauge. The apparatus may be configured to compute a voltage-based RSOC value and a current-based RSOC value and extract a capacity value from each. Over time, the capacity values will diverge and the difference in capacity values can be used to compute an actual value of the sense resistor.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, memory devices, semiconductor devices, such as transistors and capacitors, and the like, which may carry out a variety of functions. In addition, the present technology may be practiced in conjunction with any number of systems, such as automotive, aerospace, medical, scientific, surveillance, and consumer electronics, and the systems described are merely exemplary applications for the technology. Further, the present technology may employ any number of conventional techniques for measuring voltage, measuring current, measuring temperature, computing a relative state of charge (RSOC), carrying out various mathematical computations, and the like.

Figure 1:
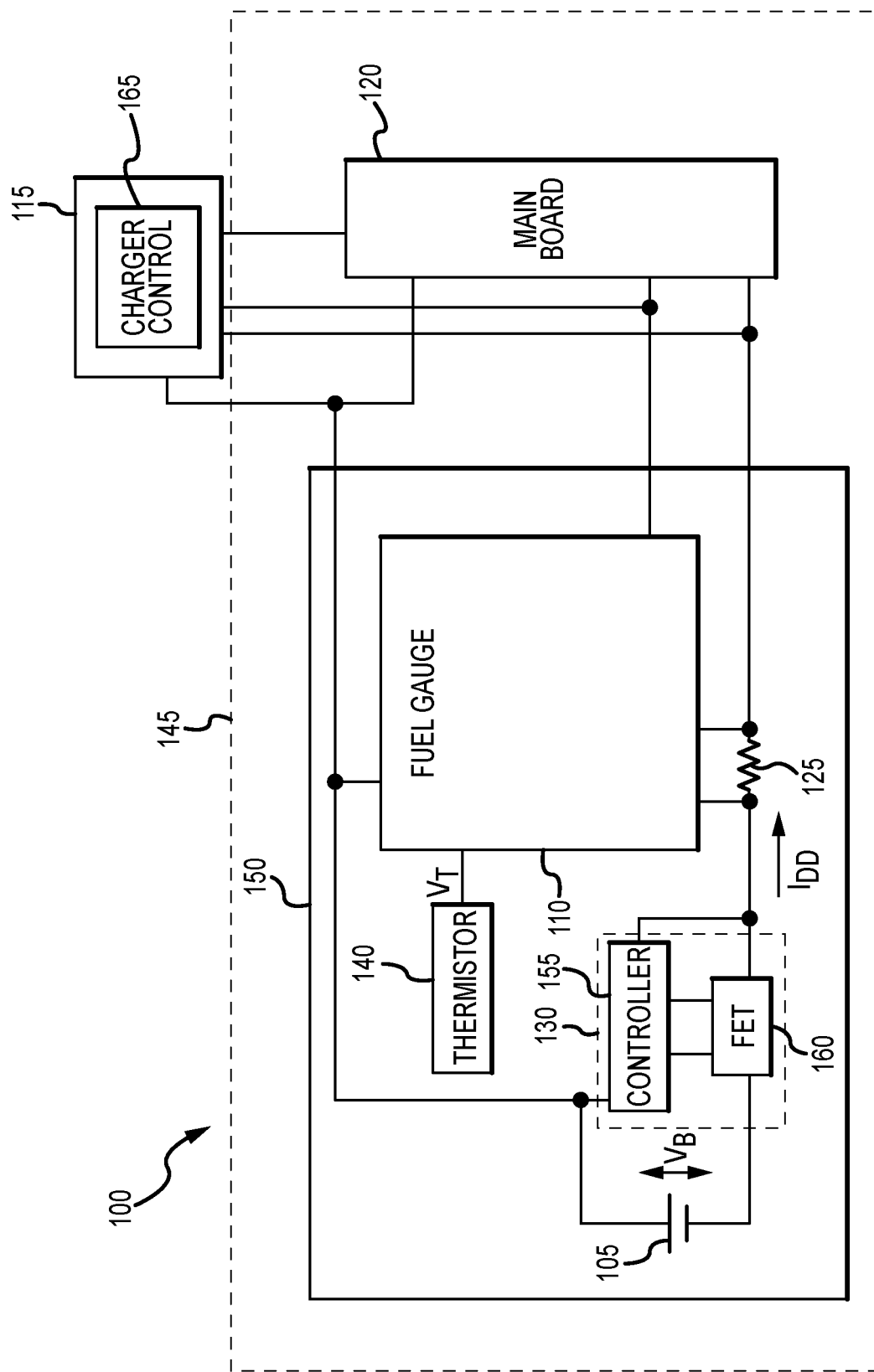
FIG. 1 is a block diagram of a battery system in accordance with an exemplary embodiment of the present technology.

Methods and apparatus for determining a resistance value of a resistor in a battery system according to various aspects of the present technology may operate in conjunction with any suitable electronic system and/or device, such as "smart devices," wearables, consumer electronics, portable devices, battery-powered vehicles, and the like. Referring to FIG. 1, an exemplary battery system 100 may be incorporated into an electronic device 145 powered by a rechargeable battery 105, such as a lithium ion battery. In an exemplary embodiment, the battery system 100 may comprise a battery pack 150 and an adapter 115, that operate together to provide suitable power levels to a main board 120 of the electronic device 145. In various embodiments, the battery system 100 may further comprise a timing unit (not shown) to operate various circuits according to a predetermined timing cycle.

The battery system 100 provides power and battery information to various components of the electronic device 145, such as the main board 120. The battery system 100 may be electrically or communicatively coupled by any suitable method to allow the battery system 100 to transmit data and/or battery information to and from the main board 120 and/or the adapter 115. The battery information may comprise any suitable criteria, such as a battery current, a capacity of the battery, a run-time of the battery, and any other desired information.

The adapter 115 may manage the battery operating states (i.e., charging and discharging), perform DC to DC conversion, perform voltage scaling, perform power sequencing, perform power-source selection, and/or other miscellaneous functions. In an exemplary embodiment, the adapter 115 may be equipped with a charger control circuit 165 to perform various charge control functions, such as providing a constant current charge and/or a constant voltage control, of the battery 105 and supply an output current to the battery 105. This particular arrangement, where the constant current charge control function and the constant voltage control function is implemented in the adapter 115, is generally referred to as "direct charging" and may be more desirable because it has been shown to provide faster charging of the battery 105 and generates less heat than other arrangements. Further, the adapter 115 generally receives information related to current flowing in/out of the battery 105 and uses this information to regulate the charging function.

The adapter 115 may further comprise various circuits and/or devices suitable for over-temperature protection, over-current protection, over-voltage protection, input over-current protection, short-circuit protection, and/or ripple control.

The adapter 115 may be connected to the electronic device 145 via any suitable power and/or data cable to supply power to and/or exchange data with the electronic device 145. For example, the adapter 115 may be connected to the battery pack 150 to receive battery current information related to a battery current $I_{DD}$. The adapter 115 may utilize the battery current information to regulate the power and/or a charging current supplied to the battery 105.

The adapter 115 may be further connected to the main board 120 of the electronic device 145 to provide power, and/or receive relevant battery data, such as a state of charge (SOC or relative state of charge (RSOC)), remaining battery capacity, and the like. The adapter 115 may also receive data from the main board 120 to ensure that the charger control circuit 165 is operating according to a particular set of specifications based on the particular application, size of the battery 105, and the like. The charger control circuit 165 may also ensure that the battery 105 is providing an appropriate amount of power to the main board 120. The adapter 115 may comprise any device and/or system suitable for battery management, voltage regulation, charging functions, and the like. In various embodiments, the adapter 115 is configured to connect to a power source, such as an AC electrical outlet, and further comprises a power and/or data terminal that connects to the electronic device 145 via the power and/or data cable.

The battery pack 150 may supply and manage power to the main board 120 of the electronic device 145. For example, the battery pack 150 may comprise the battery 105, such as a rechargeable lithium ion (Li-ion) battery, a nickel-metal-hydride battery (NiMH), a nickel-cadmium (NiCd) battery, a lithium-ion polymer (LiPo) battery, and the like. In an exemplary embodiment, the battery 105 generates a voltage $V_B$ between a negative electrode and a positive electrode of the battery 105. The battery pack 150 may further comprise a fuel gauge circuit 110 connected to the battery 105.

The battery pack 150 may further comprise a temperature sensor 140 that provides a signal according to a temperature of the battery 105. The temperature sensor may comprise a thermistor that generates a thermistor voltage $V_T$, which corresponds to the temperature of the battery 105. The temperature sensor 140 may, however, comprise any appropriate sensor or other device or system for generating a signal corresponding to the temperature of the battery 105. The temperature sensor 140 may be connected to the fuel gauge circuit 110 and configured to provide temperature data, such as the thermistor voltage $V_T$, to the fuel gauge circuit 110.

The battery pack 150 may further comprise a protection circuit 130 configured to prevent charge surges to the main board 120. In an exemplary embodiment, the protection circuit 130 may comprise a protection controller circuit 155 and a transistor circuit 160 that operate together to monitor and/or restrict the battery current $I_{DD}$ flow to the main board 120. For example, the protection circuit 130 may be connected to the positive and negative terminals of the battery 105 to monitor the battery voltage $V_B$ and/or the battery current $I_{DD}$. If the values of such variables exceed a predetermined maximum threshold, then the protection circuit 130 may utilize the protection controller circuit and/or the transistor circuit 160 to stop or reduce the current $I_{DD}$ flow from the battery 105 to the main board 120.

The protection circuit 130 may further receive information from the temperature sensor 140 to monitor the condition of the battery. If any abnormal condition is detected, for example if the temperature exceeds a predetermined maximum threshold, the protection circuit 130 stops charging or discharging of the battery 105 by turning off the transistor circuit 160 to prevent the battery from entering a dangerous condition.

The fuel gauge circuit 110 may be configured to receive various inputs, monitor various battery characteristics, such as battery capacity, operation mode (e.g., charging and discharging), a state of health (SOH), and the like. The fuel gauge circuit 110 may receive signals corresponding to various system data, such as the temperature signal from the temperature sensor 140 and/or various control signals, such as control signals from the main board 120 and/or the adapter 115.

The fuel gauge circuit 110 may also generate various types of control signals in response to received input signals or battery characteristics, such as control signals to control charging, discharging, and relaxation periods, and signals corresponding to the SOC and/or SOH of the battery 105. The fuel gauge circuit 110 may further be configured to measure various parameters of the battery 105 such as: the voltage $V_B$, the battery current $I_{DD}$, and a remaining capacity measured in ampere-hours (also expressed as the SOC or RSOC as a percentage).

Figure 2:
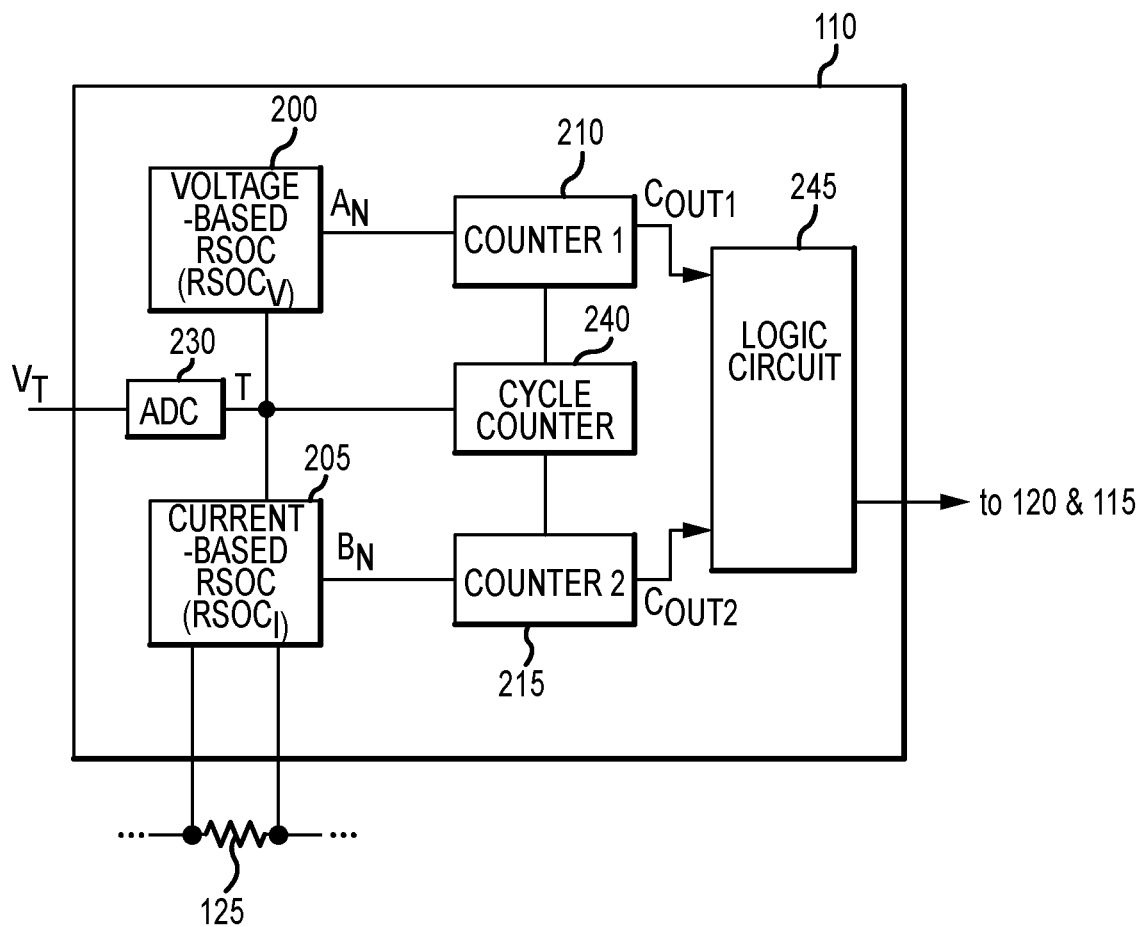
FIG. 2 is a block diagram of a fuel gauge in accordance with an exemplary embodiment of the present technology.
Figure 3:
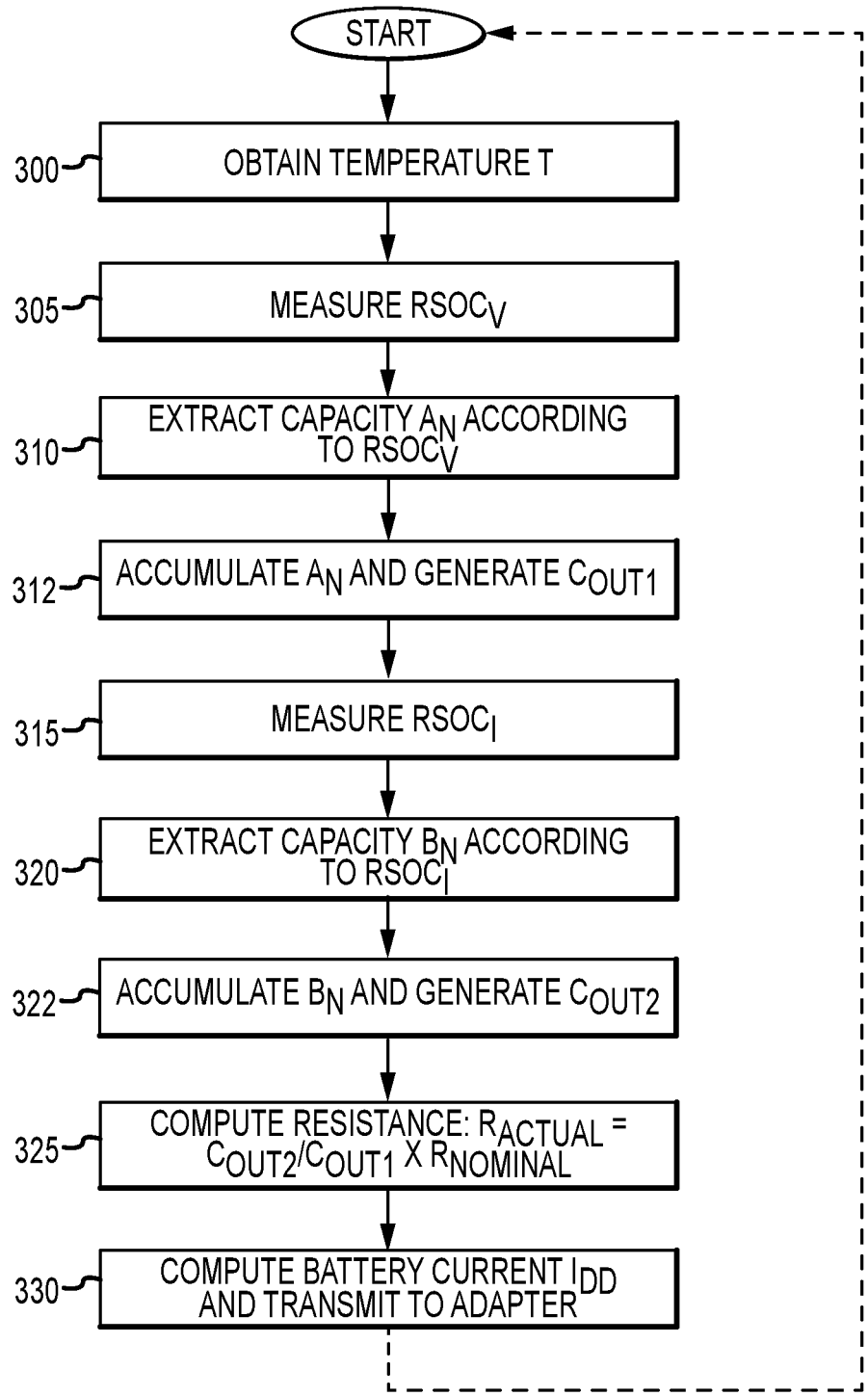
FIG. 3 is a flowchart for determining a resistance value of a sense resistor in accordance with an exemplary embodiment of the present technology.

The fuel gauge circuit 110 may be configured to perform various computations. The fuel gauge circuit 110 may comprise any number of suitable circuits and/or systems and may be implemented in any suitable manner, such as in the form of a large scale integrated (LSI) circuit. For example, and referring to FIG. 2, the fuel gauge circuit 110 may comprise an analog-to-digital converter (ADC) 230, a first RSOC computation circuit 200, a second RSOC computation circuit 205, a cycle counter 240, a first counter 210, a second counter 215, and a logic circuit 245.

In various embodiments, the fuel gauge circuit 110 may further comprise a timer (not shown) to track and measure a time interval (period of time). For example, the timer may be utilized to facilitate integration of the battery current $I_{DD}$ over a predetermined period of time and/or may be used to track periods of charging, discharging, and/or an open state (a state where the battery is neither charging nor discharging).

The ADC 230 may convert the thermistor voltage $V_T$ to a digital temperature value T. The ADC 230 may comprise any appropriate analog-to-digital architecture, and may be selected based on the particular application. The ADC 230 may be configured to transmit the digital temperature value T to the first computation circuit 200, the second computation circuit 205, and/or the cycle counter 240.

The first RSOC computation circuit 200 may be suitably configured to determine the remaining capacity (or the RSOC, when expressed as a percent) of the battery 105. In an exemplary embodiment, the first RSOC computation circuit 200 may be configured to determine a first RSOC value (RSOCv) according to the voltage $V_B$ of the battery 105. According to an exemplary embodiment, the first RSOC computation circuit 200 may utilize the computed first RSOC value to compute a first capacity value $A_N$, measured in ampere-hours (Ah) and where N is a whole number from one to infinity, and transmit the remaining first capacity value $A_N$ to the first counter 210.

In general, utilizing the voltage $V_B$ of battery 105 to determine the remaining capacity is referred to as "the voltage-based method." The first RSOC computation circuit 200 may comprise any circuit and/or system suitable for determining the RSOC according to the battery voltage $V_B$. For example, the first RSOC computation circuit 200 may comprise a memory to store open circuit voltage (OCV) data and corresponding RSOC values, such as in the form of a look-up table. In addition, "the voltage-based method" may utilize any suitable method for monitoring the battery voltage $V_B$, comparing the battery voltage $V_B$ with the OCV, and extracting the battery current $I_{DD}$ based on the battery voltage $V_B$, the OCV, and an internal resistance $R_{INT}$ of the battery 105, such as according to the formula: $I_{DD}=[V_B-OCV]/R_{INT}$.

The first RSOC computation circuit 200 may further receive the temperature T from the ADC 230. The first RSOC computation circuit 200 may be configured to selectively operate (i.e., compute the RSOC) according to the temperature T. For example, the first computation circuit 200 may operate only if the temperature T is within a predetermined range.

The first counter 210 may be configured to receive a series of first capacity values $A_N$, for example $A_1$ through $A_{10}$, and compute a first counter value $C_{OUT1}$, measured in ampere-hours or Coulombs, by accumulating the first capacity values $A_N$. For example, when the battery 105 is charging, the first capacity value will be a positive value and when the battery 105 is discharging, the first capacity values will be a negative value. The first counter 210 may comprise any circuit and/or system suitable for receiving and generating a running tally of a sequence of multiple values. For example, if the first counter 210 has a starting capacity of 10 Ah, $A_1$ is 30 Ah, $A_2$ is −20 Ah, and $A_3$ is 50 Ah, then for the period from $A_1$ to $A_3$, the first counter value $C_{OUT1}$ would equal 70 Ah. The first counter 210 may be configured to accumulate any number of first capacity values $A_N$ and may be programmed with the starting capacity.

The second RSOC computation circuit 205 may be suitably configured to determine the remaining capacity (or the RSOC, when expressed as a percent) of the battery 105. In an exemplary embodiment, the second RSOC computation circuit 205 may be configured to determine a second RSOC value ($RSOC_1$) according to the current $I_{DD}$ of the battery 105. The second RSOC computation circuit 205 may utilize the computed second RSOC value to compute a second capacity value $B_N$, measured in ampere-hours and where N is a whole number from one to infinity.

In general, utilizing the battery current $I_{DD}$ to determine the remaining capacity is referred to as "the current-based method." The second RSOC computation circuit 205 may comprise any circuit and/or system suitable for determining the RSOC according to the battery current $I_{DD}$. For example, the first RSOC computation circuit 200 may be configured to measure the in-and-out-flowing current $I_{DD}$ of the battery 105 over a period of time. This may be accomplished by utilizing a sense resistor 125 connected to the battery 105. For example, the second RSOC computation circuit 205 may measure a voltage across the sense resistor 125 as the battery 105 charges and discharges and detect and/or measure the battery current $I_{DD}$ according to a known resistance value, such as a nominal resistance $R_{nominal}$ value, of the sense resistor 125 and the voltage. The second RSOC computation circuit 205 integrates the battery current $I_{DD}$ over some period of time to compute the second RSOC value.

The second RSOC computation circuit 205 may further receive the temperature T from the ADC 230. The second RSOC computation circuit 205 may be configured to selectively operate (i.e., computing the RSOC) according to the temperature T. For example, the second computation circuit 205 may operate only if the temperature T is within a predetermined range.

In general, the sense resistor 125 has a nominal resistance $R_{nominal}$ value. However, an actual resistance $R_{actual}$ value may vary from the nominal resistance $R_{nominal}$ value by at least +/−0.5% and up to +/−2%. Accordingly, the computed second RSOC value and respective capacity value $B_N$ may contain some error.

According to an exemplary embodiment, the second RSOC computation circuit 205 may transmit the second remaining capacity value $B_N$ to the second counter 215. The second counter 215 may be configured to receive a series of second capacity values $B_N$, for example $B_1$ through $B_{10}$, and compute a second counter value $C_{OUT2}$, measured in ampere-hours or coulombs, by accumulating the second capacity values $B_N$. In an exemplary embodiment, the second counter 215 may operate in the same manner as the first counter 210.

The cycle counter 240 may be configured to detect a charge cycle and count a total number of charge cycles of the battery 105. In an exemplary embodiment, the cycle counter 240 may use information from the first and second counters 210, 215 to count the number of charge cycles. One charge cycle may be defined as a sequence of: a charging operation, followed by a discharging operation, followed by another charging operation. For example, if $A_1$ is 30 Ah (a charging operation), $A_2$ is −20 Ah (a discharging operation), and $A_3$ is 50 Ah (a charging operation), then the first counter 210 would detect one charge cycle from $A_1$ to $A_3$.

The cycle counter 240 may comprise any circuit and/or system suitable for monitoring the first and/or second capacity values $A_N$, $B_N$ and detecting a charge cycle of the battery 105 according to the first and/or second capacity values $A_N$, $B_N$. For example, the cycle counter 240 may be connected to and communicate with the first and second counter 210, 215 to receive relevant operation data and/or the first and/or second capacity values $A_N$, $B_N$.

The cycle counter 240 may be further connected to the ADC 230 and configured to receive the digital temperature value T. The cycle counter 240 may be configured to activate operation of the first and second counters 210, 215, according to the temperature value T. For example, the cycle counter 240 may activate operation of the first and second counter 210, 215 only if the temperature is within a predetermined temperature range.

The logic circuit 245 may be configured to perform various calculations, extract data from first and second counters 210, 215, and/or receive relevant battery data. The logic circuit 245 may comprise any suitable devices and/or systems, and may be realized by the use of software, hardware, or a combination thereof.

According to an exemplary embodiment, the logic circuit 245 computes the actual resistance $R_{actual}$ of the sense resistor 125 according to the nominal resistance $R_{nominal}$ of the sense resistor 125 and the first and second counter values $C_{OUT1}$, $C_{OUT2}$. For example, the logic circuit 245 may compute the actual resistance $R_{actual}$ according to the following equation: $R_{actual}=C_{OUT2}/C_{OUT1} \times R_{nominal}$. According to embodiments of the present technology, the first counter value $C_{OUT1}$ is based on absolute values for an internal resistance of the battery and the OCV. In contrast, the second counter value $C_{OUT2}$ is based on the sense resistor 125, which may have a margin of error.

According to various embodiments, the logic circuit 245 may further utilize the computed actual resistance $R_{actual}$ value, the measured voltage $V_B$, the first RSOC value, and/or the second RSOC value to extract or otherwise compute the battery current $I_{DD}$. The logic circuit 245 may transmit the actual resistance $R_{actual}$ value and/or the battery current $I_{DD}$ to the main board 120 and/or the adapter 115. The adapter 115 may utilize the actual resistance value $R_{actual}$ and/or the battery current $I_{DD}$ to adjust the output current that the adapter 115 supplies to the battery 105.

In operation, and referring to FIGS. 1-4, the adapter 115 may supply the battery 105 with the output current. During the charging operation, the fuel gauge circuit 110 may obtain the temperature T of the battery 105 (300). For example, the fuel gauge circuit 110 may receive the voltage $V_T$ from the temperature sensor 140 to obtain the temperature T. The fuel gauge circuit 110 may then measure the first RSOC value (RSOCv) (305). For example, the fuel gauge circuit 110 may utilize the first computation circuit 110 to measure the first RSOC value and extract the first capacity value $A_N$ according to the measured first RSOC value (310). The fuel gauge circuit 110 may compute multiple first RSOC values and corresponding first capacity values $A_N$ and accumulate the first capacity values $A_N$ (312). For example, the fuel gauge circuit 110 may utilize the first counter 210 to accumulate a series of first capacity values $A_N$ and generate the first counter value $C_{OUT1}$.

The fuel gauge circuit 110 may, either before, after, or simultaneously, measure the second RSOC value (RSOC$_1$) (315) and extract the second capacity value $B_N$ according to the second RSOC value (320). For example, the fuel gauge circuit 110 may utilize the second computation circuit 205 to measure the second RSOC value and determine the second capacity value $B_N$. The fuel gauge circuit 110 may compute multiple second RSOC values and corresponding second capacity values $B_N$ and accumulate the second capacity values $B_N$ (322). For example, the fuel gauge circuit 110 may utilize the second counter 215 to accumulate a series of second capacity values $B_N$ and generate the second counter value $C_{OUT2}$.

The fuel gauge circuit 110 may then receive the accumulated first and second counter values $C_{OUT1}$, $C_{OUT2}$ and compute the actual resistance $R_{actual}$ value of the sense resistor 125 according to the nominal resistance $R_{normal}$ value and the first and second counter values $C_{OUT1}$, $C_{OUT2}$ (325). For example, the fuel gauge circuit 110 may compute the actual resistance according to the equation: $R_{actual} = C_{OUT2}/C_{OUT1} \times R_{nominal}$.

The fuel gauge circuit 110 may perform the steps multiple times in succession or may be programmed to perform the steps at particular intervals, such as every $10^{th}$ charge cycle. The fuel gauge circuit 110 may also utilize the actual resistance $R_{actual}$ value to extract or otherwise compute the battery current $I_{DD}$ and transmit the computed battery current $I_{DD}$ to the adapter 115 (330).

Figure 4:
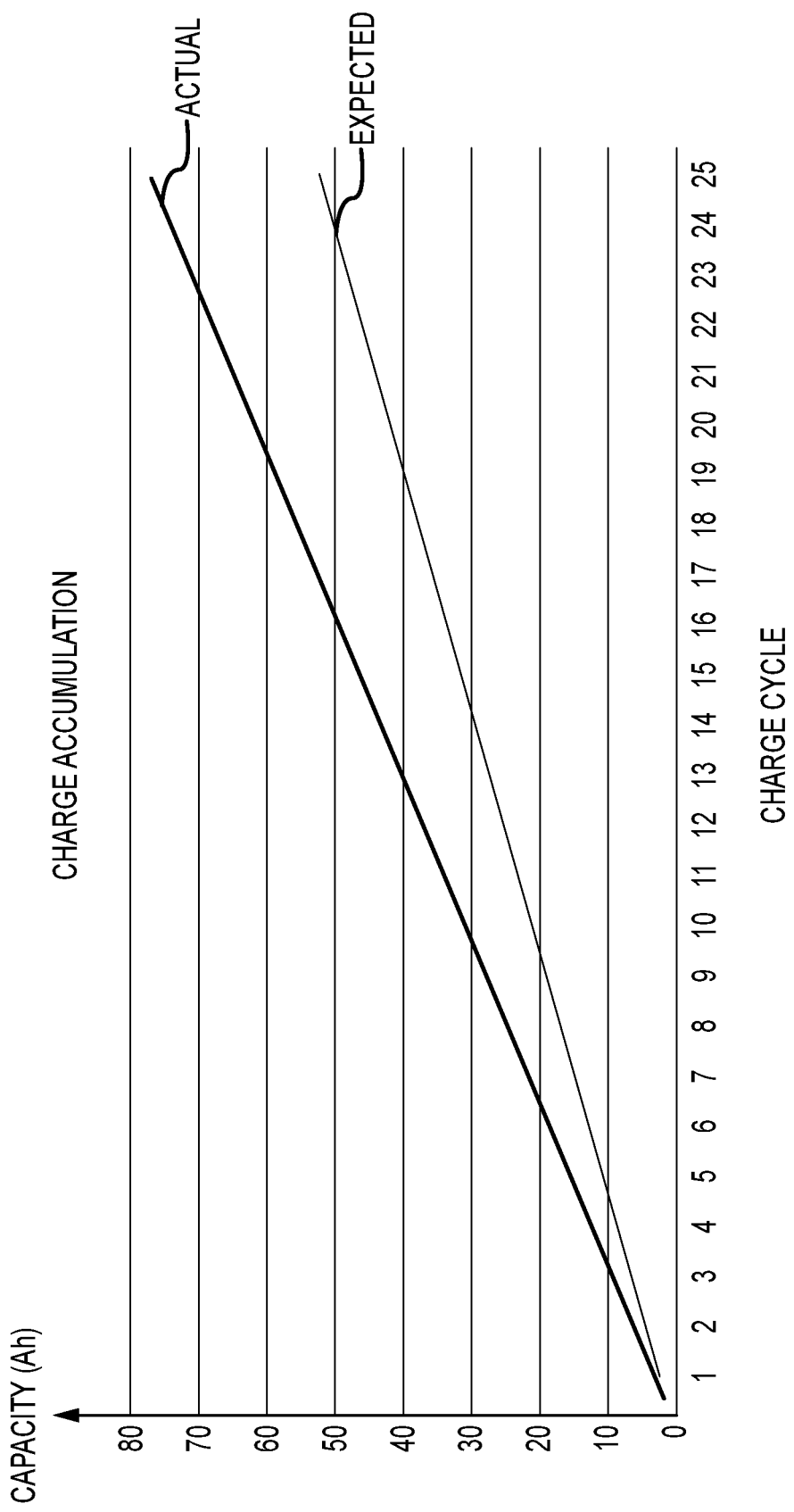
FIG. 4 is a graph illustrating an expected accumulated capacity and an actual accumulated capacity.

Referring to FIGS. 1 and 4, over time and with each charge cycle, an expected accumulated capacity value (i.e., $C_{OUT1}$, as computed according to the first counter 210, diverges from an actual accumulated capacity value ($C_{OUT2}$), as computed according to the second counter 205 and based on the actual resistance $R_{actual}$ of the sense resistor 125. In general, the capacity of the battery may be described by: $Q = I_{DD} \times time$, where Q is the charge (capacity) measured in coulombs or ampere-hours, $I_{DD}$ is the battery current, and time is measured in seconds. Accordingly, the first capacity value may be described as: $C_{OUT1} = I_{DD1} \times time$, where the battery current $I_{DD1}$ is a function of the OCV and absolute internal resistance of the battery 125. Similarly, the second capacity value $C_{OUT2}$ may be described as: $C_{OUT2} = I_{DD2} \times time$, where the battery current $I_{DD2}$ is a function of the sense resistor 125. Over time, the difference in accumulated charge values from the first and second counters 210, 215 becomes greater because of the different methods for determining the battery currents $I_{DD1}$, $I_{DD2}$. Therefore, the difference between the expected capacity value and the actual capacity value may be used to extract or otherwise compute the actual resistance $R_{actual}$ value.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus adapted to connect to a battery, comprising:
   a resistor connected to the battery and having a nominal resistance value;
   a first computation circuit connected to the battery and configured to compute a plurality of voltage-based capacity values;
   a first counter connected to the first computation circuit and configured to accumulate the plurality of voltage-based capacity values and generate a first accumulated value;
   a second computation circuit connected to the battery and configured to compute a plurality of current-based capacity values;
   a second counter connected to the second computation circuit and configured to accumulate the plurality of current-based capacity values and generate a second accumulated value; and
   a logic circuit configured to receive the first and second accumulated values and compute an actual resistance of the resistor according to the first and second accumulated values and the nominal resistance value.

2. The apparatus according to claim 1, further comprising: a temperature sensor to measure a temperature of the battery and generate temperature data.

3. The apparatus according to claim 2, wherein the first and second computation circuits are configured to receive the temperature data and selectively operate according to the temperature data.

4. The apparatus according to claim 1, further comprising: a cycle counter configured to count a total number of charge cycles of the battery according to the current-based capacity values and the voltage-based capacity values.

5. The apparatus according to claim 1, wherein the actual resistance value is equal to: the multiple of the nominal resistance value by the second accumulated value divided by the first accumulated value.

6. The apparatus according to claim 1, wherein the logic circuit is further configured to compute a battery current according to the actual resistance value and transmit the computed battery current to an external adapter, the adapter comprising a charger control circuit.

7. The apparatus according to claim 1, wherein the resistor is connected between a negative terminal of the battery and the second computation circuit.

8. A method for determining an actual resistance value of a resistor in a battery system, comprising:
   computing a plurality of first capacity values according to a voltage of a battery;
   accumulating the plurality of first capacity values and generating a first accumulated value;
   computing a plurality of second capacity values according to a current through the resistor;
   accumulating the plurality of second capacity values and generating a second accumulated value; and
   computing the actual resistance of the resistor according to the first and second accumulated values and a nominal resistance value of the resistor.

9. The method according to claim 8, wherein computing the actual resistance comprises dividing the second accumulated value by the first accumulated value and multiplying by the nominal resistance value.

10. The method according to claim 8, further comprising: measuring a temperature of the battery and selectively computing the plurality of first and second capacity values according to the measured temperature.

11. The method according to claim 8, further comprising: counting a total number of charge cycles of the battery.

12. The method according to claim 11, wherein the actual resistance value is computed when the total number of charge cycles reaches a predetermined number.

13. The method according to claim 8, wherein:
   computing a first capacity value of the plurality of first capacity values comprises: computing a first relative state of charge value; and
   computing a second capacity value of the plurality of second capacity values comprises: computing a second relative state of charge value.

14. A battery system, comprising:
   a battery;
   a sense resistor, having a nominal resistance value, connected to the battery; and
   a fuel gauge circuit connected to the battery and the sense resistor, the fuel gauge circuit comprising:
      a first computation circuit configured to compute a plurality of first capacity values;
      a first counter connected to the first computation circuit and configured to accumulate the plurality of first capacity values and generate a first accumulated value;
      a second computation circuit configured to compute a plurality of second capacity values;
      a second counter connected to the first computation circuit and configured to accumulate the plurality of second capacity values and generate a second accumulated value; and
      a logic circuit connected to the first and second counters and configured to:
         receive the first and second accumulated values; and
         compute an actual resistance value of the resistor according to:
            the first and second accumulated values; and
            the nominal resistance.

15. The battery system according to claim 14, further comprising an adapter connected to the battery and configured to:
   directly charge the battery; and
   receive battery current data from the fuel gauge circuit.

16. The battery system according to claim 14, wherein the actual resistance value is equal to: the multiple of the nominal value by the second accumulated value divided by the first accumulated value.

17. The battery system according to claim 14, further comprising a cycle counter connected to the first and second counters and configured to count a total number of charge cycles of the battery according to the plurality of first and second capacity values.

18. The battery system according to claim 14, further comprising a temperature sensor configured to measure a temperature of the battery and generate temperature data.

19. The battery system according to claim 18, wherein the first and second computation circuits are configured to receive the temperature data and selectively operate according to the temperature data.

20. The battery system according to claim 14, wherein the sense resistor is connected between a negative terminal of the battery and the second computation circuit.

* * * * *